(12) United States Patent
Huang et al.

(10) Patent No.: US 8,623,684 B2
(45) Date of Patent: Jan. 7, 2014

(54) OPTOELECTRONIC DEVICE HAVING A SANDWICH STRUCTURE AND METHOD FOR FORMING THE SAME

(75) Inventors: Jing-Shun Huang, Taipei (TW); Ching-Fuh Lin, Taipei (TW)

(73) Assignee: National Taiwan University, Taipei (TW)

( * ) Notice: Subject to any disclaimer, the term of this patent is extended or adjusted under 35 U.S.C. 154(b) by 684 days.

(21) Appl. No.: 12/726,202

(22) Filed: Mar. 17, 2010

(65) Prior Publication Data

US 2011/0127494 A1 Jun. 2, 2011

(30) Foreign Application Priority Data

Nov. 27, 2009 (TW) .............................. 098140465 A

(51) Int. Cl.
*H01L 51/40* (2006.01)

(52) U.S. Cl.
USPC ................... 438/46; 438/82; 438/85; 438/99; 438/104; 257/E51.012; 257/E51.018; 257/E51.026

(58) Field of Classification Search
USPC .......... 438/46, 82, 85, 99, 104; 257/E51.012, 257/E51.018, E51.026
See application file for complete search history.

(56) References Cited

U.S. PATENT DOCUMENTS

| | | | |
|---|---|---|---|
| 7,211,463 B2 | 5/2007 | Hu et al. | |
| 7,321,196 B2 * | 1/2008 | Cheng et al. | 313/504 |
| 8,304,270 B2 * | 11/2012 | Huang et al. | 438/47 |
| 8,338,826 B2 * | 12/2012 | Huang et al. | 257/43 |
| 8,378,337 B2 * | 2/2013 | Lin et al. | 257/40 |
| 2004/0031958 A1 * | 2/2004 | Wu et al. | 257/40 |
| 2007/0111006 A1 | 5/2007 | Meng et al. | |
| 2008/0075857 A1 | 3/2008 | Chen et al. | |
| 2009/0045738 A1 | 2/2009 | Tsutsui et al. | |
| 2009/0071539 A1 | 3/2009 | Choi et al. | |

* cited by examiner

*Primary Examiner* — Colleen Matthews
(74) *Attorney, Agent, or Firm* — Stout, Uxa, Buyan & Mullins, LLP

(57) ABSTRACT

An optoelectronic device is formed having a sandwich structure, which consists of an inorganic semiconductor layer, an organic semiconductor layer, and another inorganic semiconductor layer, where both of the two inorganic semiconductor layers are produced by a solution process.

13 Claims, 4 Drawing Sheets

```
                            30
                             ↘

┌─────────────────────────────────────────────┐
        │          providing a first electrode         │──31
        └─────────────────────────────────────────────┘
                             │
                             ▼
        ┌─────────────────────────────────────────────┐
        │  coating a first solution on the first electrode,│
        │   where the first solution is a solution or  │
        │     suspension of a plurality of micro/nano  │
        │   inorganic semiconductor structures, and the│──32
        │  micro/nano inorganic semiconductor structures│
        │      are stacked to form a first inorganic   │
        │   semiconductor layer on the first electrode │
        └─────────────────────────────────────────────┘
                             │
                             ▼
        ┌─────────────────────────────────────────────┐
        │    forming an organic semiconductor layer on │──33
        │      the first inorganic semiconductor layer │
        └─────────────────────────────────────────────┘
                             │
                             ▼
        ┌─────────────────────────────────────────────┐
        │    coating a second solution on the organic  │
        │  semiconductor layer, where the second solution│
        │   is a solution or suspension of a plurality of│
        │    micro/nano inorganic semiconductor structures,│──34
        │      and the micro/nano inorganic semiconductor│
        │     structures are stacked to form a second  │
        │   inorganic semiconductor layer on the organic│
        │              semiconductor layer             │
        └─────────────────────────────────────────────┘
                             │
                             ▼
        ┌─────────────────────────────────────────────┐
        │    forming a second electrode on the second  │──35
        │          inorganic semiconductor layer       │
        └─────────────────────────────────────────────┘
```

FIG. 2

OPTOELECTRONIC DEVICE HAVING A SANDWICH STRUCTURE AND METHOD FOR FORMING THE SAME

CROSS-REFERENCE TO RELATED APPLICATIONS

The entire contents of Taiwan Patent Application No. 098140465, filed on Nov. 27, 2009, from which this application claims priority, are incorporated herein by reference.

BACKGROUND OF THE INVENTION

1. Field of the Invention

The present invention generally relates to optoelectronic devices, and more particularly, relates to optoelectronic devices having a sandwich structure and methods for forming the optoelectronic devices.

2. Description of Related Art

Organic optoelectronic devices, such as organic solar cells (OSC), organic light emitting diodes (OLED), organic light sensors, and so on, become increasingly advantageous according to the degree produced in light-weight, small-thickness, large-area, flexible, and low-cost forms.

In order to augment the power conversion efficiency of organic optoelectronic devices, a buffer layer can be disposed between the organic layer and the transparent electrode. For example, a thin layer composed of calcium or lithium fluoride can be disposed between the aluminum electrode and the organic layer. A buffer layer including, for instance, poly(3,4-ethylenedioxythiophene), or PEDOT, can be disposed between the transparent electrode and the organic layer to increase the power conversion efficiency.

However, an aluminum electrode, or a buffer layer of calcium or lithium fluoride, is susceptible to being oxidized in the presence of air, causing the resistance of the device to increase. On the other hand, a buffer layer of PEDOT may over time result in corrosion of the transparent electrode, causing the device to be damaged.

In order to overcome the problems described above, efforts have been made to replace the aluminum electrode with a high work-function metal to be used as an anode, and with transition metal oxides, such as vanadium oxide or tungsten oxide, being formed between the anode and the organic layer for transporting or injecting holes effectively so as to increase the power conversion efficiency. In addition, another transition metal oxide, zinc oxide, which is not corrosive to the transparent electrode, can be formed between the transparent electrode (as cathode) and the organic layer to be used as an electron transporting or electron injecting layer in place of PEDOT.

The transition metal oxide layers described above are usually formed by using a vacuum evaporation process, which is costly and difficult for producing a large-area device. Some transition metal oxide layers can be formed by the sol-gel method. While it is possible to produce a large-area device using the sol-gel method, the sol-gel method includes a high temperature annealing treatment. Consequently, the processing temperature is usually higher than the glass transition temperature (Tg) of the organic material, which may result in damage to the organic layer.

SUMMARY OF THE INVENTION

The object of the present invention is to provide an optoelectronic device and its forming method. The optoelectronic device should reveal excellent performance and the method does not need a high-cost vacuum evaporation deposition and high-temperature annealing step, so that simplifies the manufacturing process, prevents the organic semiconductor layer from being damaged, and decreases the cost.

According to the object, one embodiment of the present invention provides an organic optoelectronic device, which comprises a first electrode, a first inorganic semiconductor layer on the first electrode, an organic semiconductor layer on the first inorganic semiconductor layer, a second inorganic layer on the organic semiconductor layer, and a second electrode on the second inorganic layer, wherein the first inorganic semiconductor layer and the second inorganic semiconductor layer directly contacts the organic semiconductor layer, and the first inorganic semiconductor layer and the second inorganic semiconductor layer are composed of a plurality of stacked micro/nano inorganic semiconductor structures.

According to the object, one embodiment of the present invention provides a method for forming an organic optoelectronic device. The method comprises: providing a first electrode; coating a first solution on the first electrode, wherein the first solution is a solution or suspension of a plurality of micro/nano inorganic semiconductor structures, and the micro/nano inorganic semiconductor structures are stacked to form a first inorganic semiconductor layer on the first electrode; forming an organic semiconductor layer on the first inorganic semiconductor layer; coating a second solution on the organic semiconductor layer, wherein the second solution is a solution or suspension of a plurality of micro/nano inorganic semiconductor structures, and the micro/nano inorganic semiconductor structures are stacked to form a second inorganic semiconductor layer on the organic semiconductor layer; and forming a second electrode on the second inorganic semiconductor layer.

According to the optoelectronic devices and method of the present invention, the inorganic semiconductor layers have no need to be formed by the expensive vacuum evaporation process, so that the manufacturing cost can be decreased; meanwhile, the inorganic semiconductor layers have no need to use any annealing process, so that the organic semiconductor layer will not be damaged and the performance and reliability of the device can be promoted.

BRIEF DESCRIPTION OF THE DRAWINGS

FIG. 2 shows a method for producing an organic optoelectronic device according to one embodiment of the present invention.

DETAILED DESCRIPTION OF THE INVENTION

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not described in detail in order not to obscure unnecessarily the present invention. While the drawings are illustrated in detail, it is appreciated that the quantity of the disclosed components may be greater or less than that disclosed except for instances expressly restricting the amount of the components.

Figure 1:
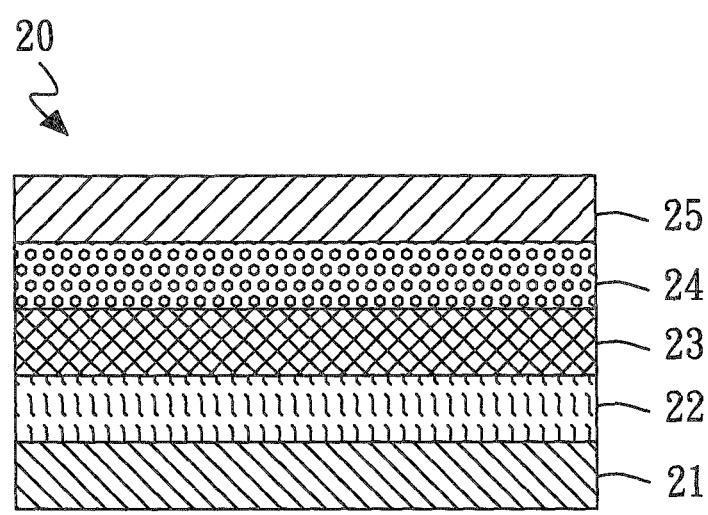
FIG. 1 shows a sectional view of an organic optoelectronic device in accordance with an embodiment of the present invention.

FIG. 1 shows a sectional view of an organic optoelectronic device 20 in accordance with an embodiment of the present invention. According to the present invention, the organic optoelectronic device 20 can be a solar cell, a light-emitting diode, a light sensor, and the like. The organic optoelectronic device 20 comprises a first electrode 21, a first inorganic semiconductor layer 22 on the first electrode 21, an organic semiconductor layer 23 on the first inorganic semiconductor layer 22, a second inorganic semiconductor layer 24 on the organic semiconductor 23, and a second electrode 25 on the second inorganic semiconductor layer 24. In addition, the organic optoelectronic device 20 may further comprise a conducting substrate (not shown) or a substrate (not shown) having a conducting surface, and the first electrode 21 is arranged on the conducting substrate or the conducting surface.

In the device described above, if the first electrode 21 is used as the anode of the organic optoelectronic device 20, then the second electrode 25 is used as the cathode of the organic optoelectronic device, the first inorganic semiconductor layer 22 is made of a material capable of transporting holes, injecting holes into the organic semiconductor layer 23 or collecting holes from the organic semiconductor layer 23 or made of a material capable of hindering electrons to be injected into the organic semiconductor layer 23 or hindering electrons from the organic semiconductor layer 23, and the second inorganic semiconductor layer 24 is made of a material capable of transporting electrons, injecting electrons into the organic semiconductor layer 23 or collecting electrons from the organic semiconductor layer 23 or made of a material capable of hindering holes to be injected into the organic semiconductor layer 23 or hindering holes from the organic semiconductor layer 23; in contrast, if the first electrode 21 is used as the cathode of the organic optoelectronic device 20, then the second electrode 25 is used as the anode of the organic optoelectronic device 20, the first inorganic semiconductor layer 22 is made of a material capable of transporting electrons, injecting electrons into the organic semiconductor layer 23 or collecting electrons from the organic semiconductor layer 23 or made of a material capable of hindering holes to be injected into the organic semiconductor layer 23 or hindering holes from the organic semiconductor layer 23, and the second inorganic semiconductor layer 24 is made of a material capable of transporting holes, injecting holes into the organic semiconductor layer 23 or collecting holes from the organic semiconductor layer 23 or made of a material capable of hindering electrons to be injected into the organic semiconductor layer 23 or hindering electrons from the organic semiconductor layer 23.

The above-mentioned material capable of transporting holes or hindering electrons comprises a material or is a material selected from a group comprising, consisting of, or consisting essentially of vanadium oxide, silver oxide, nickel oxide, molybdenum oxide, copper oxide, tungsten oxide, carbon nanotube, and combinations thereof (combination of at least two of the foregoing elements in the group); the above-mentioned material capable of transporting electrons or hindering holes comprises a material or is a material selected from a group comprising, consisting of, or consisting essentially of titanium oxide, zinc oxide, and combinations thereof.

In addition, both the first inorganic semiconductor layer 22 and the second inorganic semiconductor layer 24 are composed of a plurality of stacked micro/nano inorganic semiconductor structures, where the crystal phase of the micro/nano inorganic semiconductor structures comprises single crystalline, polycrystalline, amorphous, or a combination thereof, and the morphology of the micro/nano inorganic semiconductor structures comprises micro/nano particle, micro/nano island, micro/nano rod, micro/nano wire, micro/nano tube, micro/nano porous structure, and combinations thereof. Note that in this context the word "micro/nano" means "micro or nano" or "micro and nano." In addition, the first electrode 21 and the second electrode 25 comprise indium tin oxide (ITO), gold, silver, aluminum, or other conducting materials.

Further, the first inorganic semiconductor layer 22 and the second inorganic semiconductor 24 are produced by a solution or a suspension process, and an annealing step is not needed after the solution or suspension process.

FIG. 2 shows a method for producing an organic optoelectronic device according to one embodiment of the present invention. The method comprises the steps of: step 31, a first electrode is provided; step 32, a first solution is coated on the first electrode, where the first solution is a solution or suspension of a plurality of micro/nano inorganic semiconductor structures, and the micro/nano inorganic semiconductor structures are stacked to form a first inorganic semiconductor layer on the first electrode, noting that in this context "suspension" refers to the micro/nano inorganic semiconductor structures suspended in a solvent, "solution" refers to the suspension that further includes transition metal oxide ions or a precursor of transition metal oxide, and in one example, the solution or suspension is used as a hole-injection layer, a hole-transporting layer, an electron-injection layer, or an electron-transporting layer of the organic optoelectronic device; step 33, an organic semiconductor layer is formed on the first inorganic semiconductor layer by the solution or suspension procedure similar to the procedure described in step 32 or by other methods; step 34, a second solution is coated on the organic semiconductor layer, where the second solution is a solution or suspension of a plurality of micro/nano inorganic semiconductor structures, and the micro/nano inorganic semiconductor structures are stacked to form a second inorganic semiconductor layer on the organic semiconductor layer; step 35, a second electrode is formed on the second inorganic semiconductor layer.

In the method described in FIG. 2, if the first electrode is used as the anode of the organic optoelectronic device, then the second electrode is used as the cathode of the organic optoelectronic device, the first inorganic semiconductor layer is made of a material capable of transporting holes, injecting holes into the organic semiconductor layer or collecting holes from the organic semiconductor layer or made of a material capable of hindering electrons to be injected into the organic semiconductor layer or hindering electrons from the organic semiconductor layer, and the second inorganic semiconductor layer is made of a material capable of transporting electrons, injecting electrons into the organic semiconductor layer or collecting electrons from the organic semiconductor layer or made of a material capable of hindering holes to be injected into the organic semiconductor layer or hindering holes from the organic semiconductor layer; in contrast, if the first electrode is used as the cathode of the organic optoelectronic device, then the second electrode is used as the anode of the organic optoelectronic device, the first inorganic semiconductor layer is made of a material capable of transporting electrons, injecting electrons into the organic semiconductor layer or collecting electrons from the organic semiconductor layer or made of a material capable of hindering holes to be injected into the organic semiconductor layer or hindering holes from the organic semiconductor layer, and the second inorganic semiconductor layer is made of a material capable of transporting holes, injecting holes into the organic semiconductor layer or collecting holes from the organic semiconductor layer or made of a material capable of hindering electrons to be injected into the organic semiconductor layer or hindering electrons from the organic semiconductor layer. In addition, the above-mentioned material capable of transporting holes or hindering electrons, material capable of transporting electrons or hindering holes, and materials capable of producing the first electrode, the second electrode, and the organic semiconductor layer are the same as before. Moreover, the method may further comprise a step of forming the first electrode on a conducting substrate or a conducting surface of a substrate before step 31.

In addition, the first solution and the second solution may be coated by spin coating, jet printing, screen-printing, contact coating, dip coating, or a roll-to-roll printing method.

In addition, the second solution includes a solvent, and the dielectric constant of the solvent differs from the dielectric constant of the organic semiconductor layer to an extent that the solvent cannot dissolve or damage the organic semiconductor layer. For this purpose, the solvent can include at least one material or any combination selected from the group comprising, consisting of, or consisting essentially of: water and C1-C4 alcohols. For example, when the material of the organic semiconductor layer is poly 3-hexylthiophene (P3HT) with a dielectric constant of about 3, a suitable solvent for P3HT is isopropanol (IPA) with a dielectric constant of about 18, so as to prevent the solvent from dissolving or damaging the organic semiconductor layer.

In addition, each milliliter (ml) of the first solution and the second solution may comprise 0.01 to 100 mg of the micro/nano inorganic semiconductor structures. After the coating process, the micro/nano transition inorganic semiconductor structures are stacked to form the first inorganic semiconductor layer and the second inorganic semiconductor layer. Notice is made that an annealing step is not needed during formation of the first and second inorganic semiconductor layers, or, a heating process is employed to quickly remove the solvent where the heating process uses a low temperature that will not damage the organic semiconductor layer.

According to the embodiment of the present invention, the morphology of the micro/nano inorganic semiconductor structures comprises micro/nano particle, micro/nano island, micro/nano rod, micro/nano wire, micro/nano tube, micro/nano porous structure, or a combination thereof. An ultrasonic agitation process can treat the above solution or suspension for a suitable period so as to make the micro/nano inorganic semiconductor layer be suspended and dispersed uniformly within the solvent.

In addition, the micro/nano inorganic semiconductor structures may be a mixture comprising different kinds of inorganic semiconductors, when forming the first and second inorganic semiconductor layer. For example, the micro/nano inorganic semiconductor structures may be a mixture of vanadium oxide ($V_2O_5$) and tungsten oxide ($WO_3$). In one example, the specific concentration of the vanadium oxide ($V_2O_5$) and tungsten oxide ($WO_3$) is between 0.01 and 1 mg/ml. In a preferred example, the specific concentration of the vanadium oxide ($V_2O_5$) and the tungsten oxide ($WO_3$) is about 0.1 mg/ml. Since different kinds of micro/nano inorganic semiconductor structures will have different properties and different effects on the organic optoelectronic device, using different kinds of micro/nano inorganic semiconductor structures may optimize the characteristics of the organic optoelectronic device.

The provided solution or suspension coating method for forming the inorganic semiconductor layer has many advantages. For example, equipment for solution or suspension coating is typically low-cost and can quickly produce large-area devices; after the solvent of the solution or suspension is removed, the first and second inorganic semiconductor layer are formed. Compared to the conventional vacuum evaporation process, the present invention provides a low-cost and more efficient way.

The micro/nano inorganic semiconductor structures employed by the solution or suspension method can be single crystalline, polycrystalline, or amorphous. The crystal phase of the first or second inorganic semiconductor layer is the same as that of the micro/nano inorganic semiconductor structures. Therefore, the crystal phase of the first or second inorganic semiconductor layer can be controlled in advance without any annealing treatment.

Figure 3:
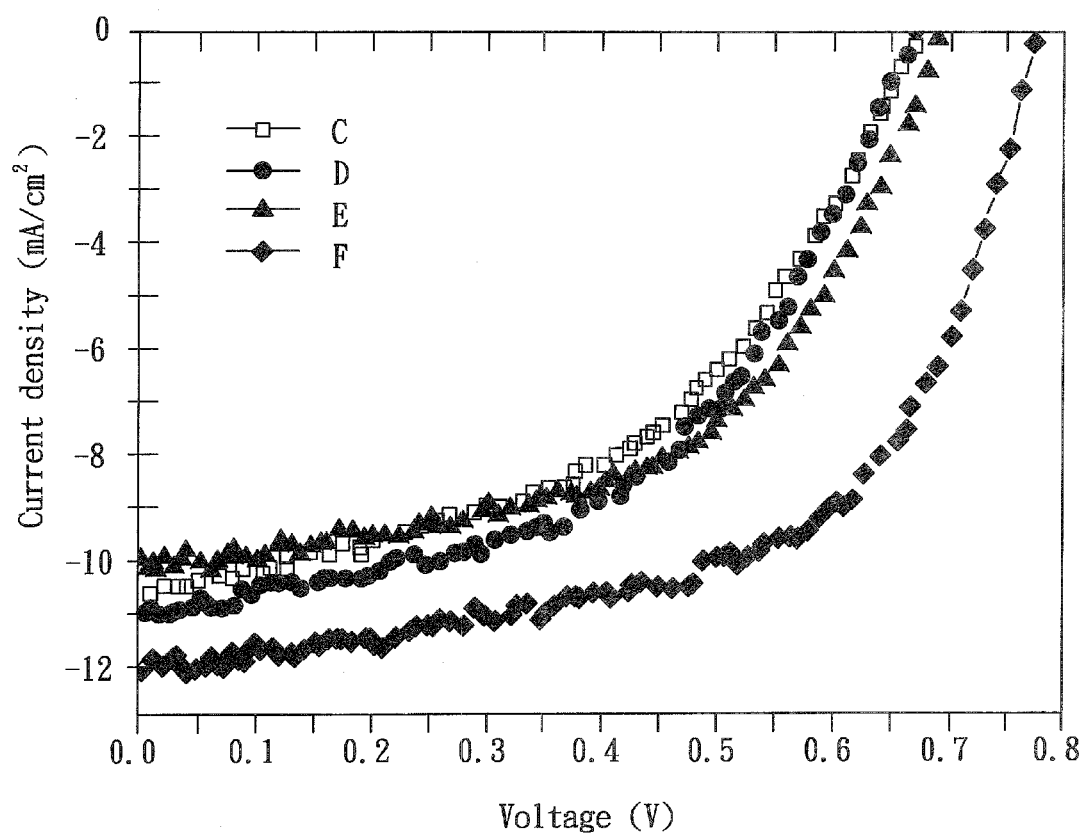
FIG. 3 shows current-voltage characteristics of different organic optoelectronic devices produced by embodiments of the present invention.

FIG. 3 shows current-voltage characteristics of different organic optoelectronic devices produced by embodiments of the present invention, where all optoelectronic devices employ zinc oxide as the inorganic semiconductor layer for transporting electrons or hindering holes, and different optoelectronic devices employ different material as the inorganic semiconductor layer for transporting holes or hindering electrons. The device C is a solar cell without the inorganic semiconductor layer for transporting holes or hindering electrons. The device D is a solar cell employing vanadium oxide ($V_2O_5$) as the inorganic semiconductor layer for transporting holes or hindering electrons. The device E is a solar cell employing tungsten oxide ($WO_3$) as the inorganic semiconductor layer for transporting holes or hindering electrons. The device F is a solar cell employing a mixture of vanadium oxide ($V_2O_5$) and tungsten oxide ($WO_3$) as the inorganic semiconductor layer for transporting holes or hindering electrons, wherein the weight ratio of vanadium oxide ($V_2O_5$) and tungsten oxide ($WO_3$) is 1:1.

The current-voltage characteristics of all optoelectronic devices are measured under the same light intensity 100 mA/cm$^2$. As shown in FIG. 3, the fill factor of the device F is highest; the fill factor of the device C is lowest; the fill factors of the devices D and E are intermediary or in the middle. It is concluded that by employing both of the first and second semiconductor layer, the current-voltage characteristics of the solar cells can be improved; moreover, the solar cell employing the mixture of vanadium oxide ($V_2O_5$) and tungsten oxide ($WO_3$) as the inorganic semiconductor layer reveals the best performance, because the mixed inorganic semiconductor layer can effectively decrease current leakage better than the others.

Figure 4:
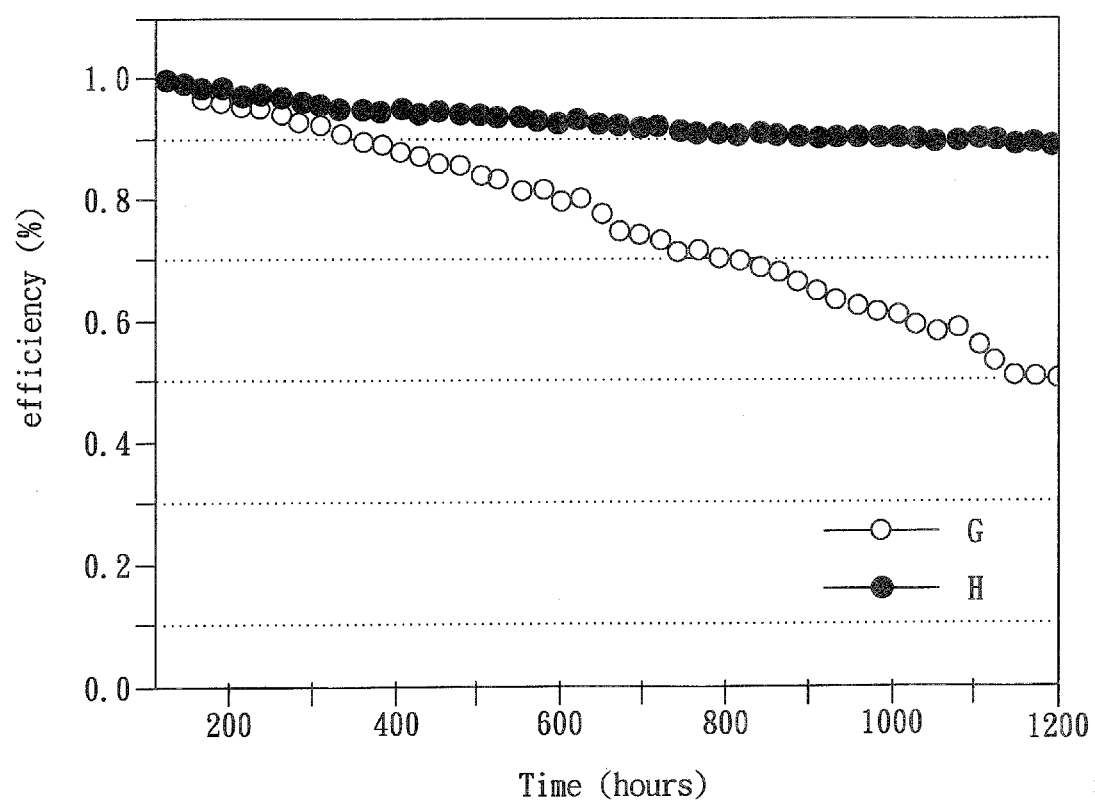
FIG. 4 shows life characteristics of different organic optoelectronic devices produced by embodiments of the present invention.

FIG. 4 shows life characteristics of different organic optoelectronic devices produced by embodiments of the present invention, where all optoelectronic devices employ zinc oxide as the inorganic semiconductor layer for transporting electrons or hindering holes, and different optoelectronic device employs different material as the inorganic semiconductor layer for transporting holes or hindering electrons. The device G is a solar cell without the inorganic semiconductor layer for transporting holes or hindering electrons. The device H is a solar cell employing a mixture of vanadium oxide and tungsten oxide as the inorganic semiconductor layer for transporting holes or hindering electrons.

The devices G and H are un-encapsulated and placed in air for comparing the life characteristics. As shown in FIG. 4, after being placed in air for 1200 hours, the efficiency of the device H decreases to 90% of the highest efficiency. The decreasing amount is about 10%. After being stored in air for 1200 hours, the efficiency of the device G decreases to 50% of the highest efficiency. The decreasing amount is about 50%. It is concluded that the first and second semiconductor layer can prevent moisture from entering the device effectively; therefore the damage of the organic semiconductor layer caused by the moisture can be avoided.

Because the first and second inorganic semiconductor layer of the present invention can prevent moisture from entering the device, the stability of the device can be improved greatly. Moreover, the device can be encapsulated with low-level technologies for decreasing the encapsulating cost.

According to the optoelectronic devices and methods of the present invention, the inorganic semiconductor layers have no need to be formed by the expensive vacuum evaporation process, so that the manufacturing cost can be decreased; meanwhile, the inorganic semiconductor layers have no need to use any annealing process, so that the organic semiconductor layer will not be damaged and the performance and reliability of the device can be promoted.

Although specific embodiments have been illustrated and described, it will be appreciated by those skilled in the art that various modifications may be made without departing from the scope of the present invention, which is intended to be limited solely by the appended claims.

What is claimed is:

1. A method for forming an organic optoelectronic device, comprising:
   providing a first electrode;
   coating a first solution on the first electrode, wherein the first solution is a solution or suspension comprising a plurality of micro/nano inorganic semiconductor structures and a first solvent, and after the first solvent is removed, the micro/nano inorganic semiconductor structures are stacked to form a first inorganic semiconductor layer on the first electrode in a physical manner;
   forming an organic semiconductor layer on the first inorganic semiconductor layer;
   coating a second solution on the organic semiconductor layer, where the second solution is a solution or suspension comprising a plurality of micro/nano inorganic semiconductor structures and a second solvent, and after the second solvent is removed, the micro/nano inorganic semiconductor structures are stacked to form a second inorganic semiconductor layer on the organic semiconductor layer in a physical manner; and
   forming a second electrode on the second inorganic semiconductor layer;
   wherein an annealing step is not needed during and after forming the first inorganic semiconductor layer and the second inorganic semiconductor layer.

2. The method according to claim 1, wherein the first electrode is used as the anode of the organic optoelectronic device, the second electrode is used as the cathode of the organic optoelectronic device, the first inorganic semiconductor layer is made of a material capable of transporting holes, injecting holes into the organic semiconductor layer or collecting holes from the organic semiconductor layer or made of a material capable of hindering electrons to be injected into the organic semiconductor layer or hindering electrons from the organic semiconductor layer, and the second inorganic semiconductor layer is made of a material capable of transporting electrons, injecting electrons into the organic semiconductor layer or collecting electrons from the organic semiconductor layer or made of a material capable of hindering holes to be injected into the organic semiconductor layer or hindering holes from the organic semiconductor layer.

3. The method according to claim 2, wherein the material capable of transporting holes or hindering electrons is selected from a group consisting essentially of vanadium oxide, silver oxide, nickel oxide, molybdenum oxide, copper oxide, tungsten oxide, carbon nanotube, and combinations thereof.

4. The method according to claim 2, wherein the material capable of transporting electrons or hindering holes is selected from a group consisting essentially of titanium oxide, zinc oxide, and combinations thereof.

5. The method according to claim 1, wherein the first electrode is used as the cathode of the organic optoelectronic device, then the second electrode is used as the anode of the organic optoelectronic device, the first inorganic semiconductor layer is made of a material capable of transporting electrons, injecting electrons into the organic semiconductor layer, or collecting electrons from the organic semiconductor layer or made of a material capable of hindering holes to be injected into the organic semiconductor layer or hindering holes from the organic semiconductor layer, and the second inorganic semiconductor layer is made of a material capable of transporting holes, injecting holes into the organic semiconductor layer or collecting holes from the organic semiconductor layer or made of a material capable of hindering electrons to be injected into the organic semiconductor layer or hindering electrons from the organic semiconductor layer.

6. The method according to claim 5, wherein the material capable of transporting holes or hindering electrons is selected from a group consisting essentially of vanadium oxide, silver oxide, nickel oxide, molybdenum oxide, copper oxide, tungsten oxide, carbon nanotube, and combinations thereof.

7. The method according to claim 5, wherein the material capable of transporting electrons or hindering holes is selected from a group consisting essentially of titanium oxide, zinc oxide, and combinations thereof.

8. The method according to claim 1, wherein the dielectric constant of the second solvent differs from the dielectric constant of the organic semiconductor layer to an extent that the second solvent cannot dissolve or damage the organic semiconductor layer.

9. The method according to claim 8, wherein the second solvent is selected from a group consisting essentially of water. C1-C4 alcohols, and combinations thereof.

10. The method according to claim 1, wherein each milliliter of the first solution and the second solution comprises 0.01 to 100 mg of the micro/nano inorganic semiconductor structures.

11. The method according to claim 1, wherein the first solution and the second solution are coated by spin coating, jet printing, screen-printing, contact coating, dip coating, or a roll-to-roll printing method.

12. The method according to claim 1, wherein the crystal phase of the micro/nano inorganic semiconductor structures comprises single crystalline, polycrystalline, amorphous, or a combination thereof.

13. The method according to claim 1, wherein the morphology of the micro/nano inorganic semiconductor structures comprises micro/nano particle, micro/nano island, micro/nano rod, micro/nano wire, micro/nano tube, micro/nano porous structure, or a combination thereof.

* * * * *